(12) United States Patent
Bjoerk et al.

(10) Patent No.: US 8,969,931 B2
(45) Date of Patent: Mar. 3, 2015

(54) SEMICONDUCTOR DEVICES WITH SCREENING COATING TO INHIBIT DOPANT DEACTIVATION

(75) Inventors: Mikael T. Bjoerk, Affoltern am Albis (CH); Joachim Knoch, Castrop-Rauxel (DE); Heike E. Riel, Baech (CH); Walter Heinrich Riess, Thalwil (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 13/503,868

(22) PCT Filed: Oct. 18, 2010

(86) PCT No.: PCT/IB2010/054707
§ 371 (c)(1),
(2), (4) Date: Jul. 17, 2012

(87) PCT Pub. No.: WO2011/051854
PCT Pub. Date: May 5, 2011

(65) Prior Publication Data
US 2012/0280292 A1    Nov. 8, 2012

(30) Foreign Application Priority Data

Oct. 30, 2009  (EP) ..................... 09174663

(51) Int. Cl.
*H01L 29/76* (2006.01)
*H01L 23/62* (2006.01)
*H01L 21/336* (2006.01)
*H01L 29/775* (2006.01)
*B82Y 10/00* (2011.01)
*H01L 29/06* (2006.01)
*H01L 29/40* (2006.01)
*H01L 29/423* (2006.01)
*H01L 29/786* (2006.01)
*H01L 23/29* (2006.01)

(52) U.S. Cl.
CPC ............ *H01L 29/775* (2013.01); *B82Y 10/00* (2013.01); *H01L 29/0665* (2013.01); *H01L 29/402* (2013.01); *H01L 29/42392* (2013.01); *H01L 29/78606* (2013.01); *H01L 29/78621* (2013.01); *H01L 29/78696* (2013.01); *H01L 23/29* (2013.01); *Y10S 977/773* (2013.01); *Y10S 977/78* (2013.01)
USPC ............ 257/288; 257/355; 257/E21.409; 257/E29.255; 257/E27.06; 257/E29.273; 438/300; 438/457; 977/773; 977/780

(58) Field of Classification Search
CPC ........... H01L 29/41733; H01L 29/458; H01L 29/78621; H01L 29/6659; H01L 29/7833; H01L 29/6653; H01L 29/41775; H01L 29/0665; H01L 29/402; H01L 29/78696; H01L 29/775; H01L 29/78606; H01L 29/42392; H01L 21/823807; H01L 21/823814; H01L 21/823431; H01L 21/823821; H01L 21/845; H01L 27/0886; H01L 27/0924; H01L 27/10826; H01L 27/10897; H01L 27/1221; H01L 23/29; H01L 23/60; H01L 23/3107; H01L 29/41791; H01L 29/517; H01L 29/833; H01L 29/66772; H01L 29/66795; H01L 29/6636; H01L 29/7831; H01L 29/7843; H01L 29/786; B82Y 10/10
USPC ........... 267/288, 355, 607, 213, 347, 914, 57, 267/59, E21.409, E21.17, E21.37, E21.628, 267/E21.618, E26.633, E21.632, E21.431, 267/E29.193, E29.255, E29.296, E29.273, 267/E27.112, E27.06; 438/300.233, 667, 438/674, 938; 977/773, 780
See application file for complete search history.

(56) References Cited

U.S. PATENT DOCUMENTS

| 2005/0017304 | A1 | 1/2005 | Matsushita et al. |
| 2007/0001231 | A1* | 1/2007 | Currie .......................... 257/368 |
| 2007/0114611 | A1 | 5/2007 | Chidambarrao et al. |
| 2008/0261369 | A1 | 10/2008 | Chidambarrao et al. |

| | | | | |
|---|---|---|---|---|
| 2010/0027192 | A1* | 2/2010 | Perry et al. | 361/323 |
| 2011/0121363 | A1* | 5/2011 | Cheng et al. | 257/190 |
| 2011/0165405 | A1* | 7/2011 | Miller | 428/292.1 |
| 2013/0023124 | A1* | 1/2013 | Nemani et al. | 438/703 |

FOREIGN PATENT DOCUMENTS

| | | | | |
|---|---|---|---|---|
| WO | WO-2009072983 | A1 | | 6/2009 |
| WO | WO 2009072983 | A1 * | 6/2009 | H01L 29/06 |

OTHER PUBLICATIONS

Diarra_et_al—Ionization energy of donor and acceptor impurities in semiconductor nanowires Importance of confinement—Physical review B 75 2007.pdf.*
Virginia Semiconductor The General property of Si Ge—2002.pdf.*
Dielectric constant of Hf02 and SiO2 wikipedia.pdf.*
Diarra, et al., "Ionization energy of donor and acceptor impurities in semiconductor nanowires: Importance of dielectric confinement," Physical Review B, vol. 75, Jan. 3, 2007, pp. 045301-1-4.
Bjork, M. et al. "Donor Deactivation in Silicon Nanostructures" Nature Nanotechnology, vol. 4. Jan. 2009. pp. 103-107.

\* cited by examiner

*Primary Examiner* — Chuong A Luu
*Assistant Examiner* — Moazzam Hossain
(74) *Attorney, Agent, or Firm* — Tutunjian & Bitetto, P.C.; Jennifer R. Davis

(57) ABSTRACT

A semiconductor device and a method for fabricating the semiconductor device. The device includes: a doped semiconductor having a source region, a drain region, a channel between the source and drain regions, and an extension region between the channel and each of the source and drain regions; a gate formed on the channel; and a screening coating on each of the extension regions. The screening coating includes: (i) an insulating layer that has a dielectric constant that is no greater than about half that of the extension regions and is formed directly on the extension regions, and (ii) a screening layer on the insulating layer, where the screening layer screens the dopant ionization potential in the extension regions to inhibit dopant deactivation.

15 Claims, 2 Drawing Sheets

SEMICONDUCTOR DEVICES WITH SCREENING COATING TO INHIBIT DOPANT DEACTIVATION

CROSS-REFERENCE TO RELATED APPLICATION

This is a U.S. National Phase application which claims priority from International Application PCT/IB2010/054707, filed Oct. 18, 2010, which in turn claims priority from European Patent Application No. 09174663.6, filed on Oct. 30, 2009. The entire contents of both of these applications are incorporated herein by reference.

This invention relates generally to semiconductor devices with gate-source/drain extensions and to methods of fabricating such devices.

With the continued reduction in size of microelectronic devices in line with the predictions of Moore's law, improved device architectures must be developed to meet the more stringent size constraints. In devices based on FET (field effect transistor) architectures with source, gate and drain structures, one such development is the provision of gate-source and gate-drain extension regions. These "extensions" are regions of the semiconductor structure which extend between the channel, which is overlaid by the gate, and each of the source and drain regions. Such extensions are employed in various transistor architectures. Examples include FinFETs, Trigate FETs and surround gate NW (nanowire) FETs which are being developed to replace current planar field effect transistors. The functionality of these devices relies heavily on the controlled creation of doped regions within the semiconductor structure to achieve a specific density of free carriers.

With further reduction in size, device dimensions will ultimately approach the one-dimensional limit, at which point quantum confinement and surface segregation of dopants will limit the free carrier concentrations and therefore also device functionality. However, as demonstrated in "Donor deactivation in silicon nanostructures", Bjork et al., Nature Nanotechnology 4, 103-107, 2008, even at dimensions far above the point where quantum effects set in, the dopant ionization energy in silicon nanowires increases and profoundly modifies the attainable free charge-carrier density. For example, at a wire radius of 15 nm, the free carrier density is already 50% lower than in bulk silicon. As discussed in the referenced article, this deactivation of dopants is due to the dielectric mismatch between the wire and its surroundings. It has been demonstrated via simulations that coating nanowires in a high-K dielectric material could prevent this dopant deactivation. (A "high-K" material as used herein has the usual meaning which is well-established in the art, being a material with a dielectric constant K which is high compared to that of silicon dioxide. High-K materials typically have a dielectric constant of about 10 to 25 or even higher). For FET-based structures, however, such a coating would increase capacitive gate-source/drain parasitics and reduce carrier mobility, and would therefore be detrimental to device performance. The foregoing reference therefore proposes that regions not covered by a gate stack in FET designs must have very high doping levels to counter the dopant deactivation effect.

In line with the foregoing, an ITRS (International Technology Roadmap for Semiconductors) organization document "ITRS FEP Challenges", http://www.itrs.net/Links/2004Summer/Presentations/FEP.pdf, page 8, shows an FET structure with the high-K gate dielectric layers extending over gate-source/drain extensions and identifies extension parasitics as a challenge. The effect of dielectric mismatch on nanowires is also discussed in "Ionization energy of donor and acceptor impurities in semiconductor nanowires: Importance of dielectric confinement", Diarra et al., Physical Review B 75, 045301 (2007). This suggests that dopant deactivation could be reduced by surrounding silicon nanowires by a metallic gate or a high-K dielectric material. The Institute of Microelectronics publication "IME Researchers Successfully Developed Ultra-scaled GAA SiNW FET with NiSi Source/Drain Extensions", http://www.ime.a-star.edu.sg/html/highlights_200807_01.html discloses nickel silicidation of extension regions in silicon NW FETs. US Patent Applications publication No's. US 2007/0114611A1 and US 2008/0261369A1 disclose application of a metallic layer to extension regions in a MOSFET.

One aspect of the present invention provides according to an embodiment a semiconductor device comprising:
 a doped semiconductor having a source region, a drain region, a channel between the source and drain regions, and an extension region between the channel and each of the source and drain regions;
 a gate formed on the channel; and
 a screening coating on each extension region;
 wherein the screening coating comprises an insulating layer, having a dielectric constant no greater than about half that of the extension region, formed directly on the extension region and a screening layer on the insulating layer, the coating being such that the screening layer screens the dopant ionization potential in the extension region to inhibit dopant deactivation.

In embodiments of this invention, therefore, a screening coating applied to gate-source/drain extension regions has an insulating layer between the extension region and a screening layer. The insulating layer is formed directly on the surface of the extension region and has a low dielectric constant K, K being no greater than about half that of the semiconductor extension region and preferably as low as possible. This insulating layer will be referred to herein as the "low-K layer". The screening layer can comprise any material which can provide screening for the dopant ionization potential in the extension region to inhibit the dopant deactivation effect discussed above. In particular, dielectric mismatch may cause dopant deactivation due to formation of image charges at the semiconductor surface which adversely affect the ionization potentials of impurity (dopant) atoms. The dopant ionization potential can be screened from such image charges by suitable formation of a screening layer, comprising an appropriate screening material, in the coating structure, and various examples will be described below. Moreover, provision of the low-K layer between the screening layer and the extension region may give superior properties in the resulting structure. In particular, the low-K layer inhibits remote phonon scattering and allows low trap density interfaces supporting good transport properties. Provision of the low-K layer can thus counter potentially detrimental effects of the screening layer. In devices embodying this invention, therefore, the advantageous effects of the screening layer can be exploited while at the same time achieving high conductance and high mobility in the extension regions, giving superior device performance.

In general in devices embodying the invention, the doped semiconductor may have other regions in addition to those specified above, and individual regions of the semiconductor may be differently doped to provide the required functionality. In general, the various regions may be defined by shaping of the semiconductor, e.g. by an etching process, as well as by doping. Also, devices may in general include one or more gates. Such a gate is typically formed as a stack structure containing a high-K dielectric layer (which may be a composite of more than one material layer) overlaid by a conductive layer, e.g. a metal or silicide layer, forming the gate electrode.

The screening layer is preferably formed directly on the insulating layer and the screening and insulating layers are preferably each unitary layers. That is, each layer is preferably a non-composite layer, being formed of a single layer of material. In this way, the thickness of the coating can be kept low and residual parasitic effects decreased. Alternatives might be envisaged, however, and this is discussed further below.

A second aspect of the invention provides according to an embodiment a method for fabricating a semiconductor device. The method comprises:

forming of doped semiconductor a source region, a drain region, a channel between the source and drain regions, and an extension region between the channel and each of the source and drain regions;

forming a gate on the channel; and forming a screening coating on each extension region;

wherein the screening coating is formed by forming an insulating layer, having a dielectric constant no greater than about half that of the extension region, directly on the extension region and forming a screening layer on the insulating layer, the coating being such that the screening layer screens the dopant ionization potential in the extension region to inhibit dopant deactivation.

In general, where features are described herein with reference to a device embodying the invention, corresponding features may be provided in a method embodying the invention, and vice versa.

Preferred embodiments of the invention will now be described, by way of example, with reference to the accompanying drawings in which.

Figure 1:
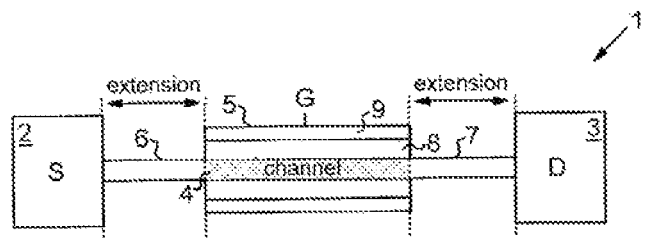
FIG. 1 illustrates the basic structure of a surround gate NW FET.

The exemplary embodiments of the invention to be described with reference to FIGS. 2 to 6 are based on a surround gate NW FET structure. FIG. 1 is a schematic cross-section of a surround gate NW FET showing the basic structure of the device. The FET 1 has a source region (S) 2, a drain region (D) 3, and a channel 4, shown shaded in the figure, located between the source 2 and drain 3. The channel 4 is overlaid by the gate structure (G) which is indicated generally at 5. A gate-source extension region 6 extends between the channel 4 and source 2. Similarly, a gate-drain extension region 7 extends between the channel 4 and drain 3. The source 2, drain 3, channel 4, and extensions 6, 7 are formed by doped regions of a semiconductor body, with the channel and extensions being formed as a nanowire extending between the source and drain contacts 2, 3. The gate 5 is formed as a cylindrical structure surrounding the channel portion of the nanowire. The gate is formed as a "stack" comprising one or more layers of high-K dielectric material forming the gate dielectric 8 overlaid by a conductive layer 9 forming the gate electrode.

The basic NW FET structure of FIG. 1 can be fabricated using well-known techniques as will be apparent to those skilled in the art. Only a brief description of an exemplary fabrication process will therefore be given here. In this example, device 1 is formed on an SOI (silicon-on-insulator) wafer. We assume here that device 1 is an nFET device, having an n-type channel, so that the process begins with a wafer formed of n-type silicon on the insulating oxide layer. The nanowire and the source and drain contact pads are first defined by lithography and dry etching and oxidation of the silicon. The wire, which is lying on the oxide of the SOI wafer, is then under-etched so that no contact to oxide exists. The resulting nanowire typically has a diameter of about 2 to 20 nm. Next, the gate dielectric is deposited on the nanowire. The gate dielectric consists of one or more layers of high-K material which can be deposited, for instance, by atomic layer deposition. Following the gate dielectric, a polysilicon layer is deposited on the gate by chemical vapor deposition (for polysilicon gate devices) or a metal layer 9 is deposited by evaporation (for metal gate devices). A $SiO_2$ hard mask is then deposited covering the entire device and lithography and etching techniques are applied to define the gate length, removing excess material and leaving the gate stack overlying the channel section 4 of the nanowire. The hardmask covering the gate stack is then removed in hydrofluoric acid. Next, the source and drain contact areas 2, 3 and the extensions 6, 7 are implanted with donor ions to produce n+ doped regions. A SiN spacer is then formed to cover the extension regions and a second implant is made to achieve maximum doping in the source and drain regions. After removing the SiN hardmask in hydrofluoric acid, the resulting structure is annealed to activate the implanted donors. Following this, the source and drain contacts, and the gate if polysilicon has been used, are silicided to produce the conductive layer forming the source and drain contact electrodes (not shown in the figure) and the gate electrode 9 for a polysilicon gate. The silicide layer can be formed as a layer of nickel deposited by evaporation or sputtering and then annealed at elevated temperatures to form $NiSi_2$ for example.

The foregoing describes the basic structure of a nanowire FET. Embodiments of the present invention based on this structure will now be described with reference to FIGS. 2 to 6. In these embodiments, a screening coating is applied to the gate-source/drain extensions 6 and 7. In the preferred examples to be described, the screening coating has a simple two-layer structure, this layer structure covering the surface of the extension regions to form a coating for these regions.

Figure 2:
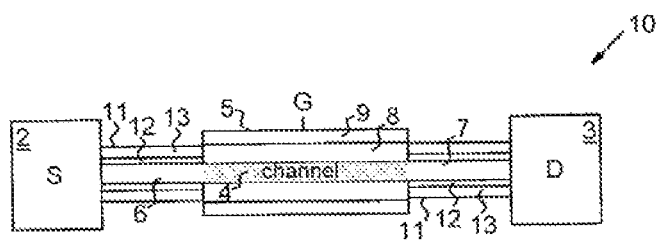
FIG. 2 illustrates a first device embodying the invention.

FIG. 2 illustrates a first example of a NW FET embodying the invention. In this and subsequent figures, structures corresponding to those shown in FIG. 1 are marked with like reference numerals. The FET device 10 of FIG. 2 has a coating, indicated generally at 11, formed on each of the gate-source and gate-drain extensions 6 and 7. The coating 11 includes a first, insulating layer 12 which is formed directly on the surface of extensions 6, 7. The insulating layer 12 is formed of a low-K dielectric material, the material having a dielectric constant no greater than about half that of the extension region. The key point here is that the dielectric constant should not be close to that of the semiconductor extension regions, i.e. this layer should have a K which is low compared to that of the extension regions and yield low interface defect densities. Dielectric constants of up to approximately half that of the extension region are considered appropriate for this layer. Bearing in mind the dielectric constants of semiconductors from which extension regions might be formed in embodiments of the invention, the insulating layer will therefore typically have a dielectric constant no greater than 5. Preferably, however, the dielectric constant of the insulating layer is lower than the maximum envisaged. For example, the insulating layer could be formed of an oxide of the semiconductor of the extension regions. In the Si NW FET 10 of this example, the insulating layer 12 is a layer of silicon dioxide which has a dielectric constant of K=3.9. This layer can be formed by a process of thermal oxidation. In this example, the layer 12 is formed to a thickness of approximately 0.5 to 1.5 nm.

The screening layer 13 of this embodiment is formed of a high-K insulating material. Such materials typically have a K of at least 10 to 25. In general, the material of this layer is ideally selected to have a dielectric constant which is at least as high, and most preferably higher, than that of the semiconductor extension region. In this example, layer 13 is formed as a layer of $HfO_2$. This has a dielectric constant of K=18 to 25 which compares to K=11.9 for the silicon extension region. Layer 13 can be formed by a process of atomic layer deposition and has a thickness here of approximately 10 nm.

The construction of coating 11 in device 10 is such that high-K layer 13 serves to screen the dopant ionization potential in the underlying extension region 6, 7, avoiding the dopant deactivation effect discussed above. In particular, the high-K layer removes the dielectric mismatch described earlier, screening the dopant ionization potential in the extension region from image charges similarly to the screening effect of a bulk semiconductor. Though such a high-K layer might be expected to cause a deterioration in transport properties as discussed earlier, coating 11 not only counters doping deactivation but also ensures high conductance and high mobility of the ungated regions 6, 7. The low-K layer 12 between the screening layer 13 and the extension region 6, 7 gives superior interface properties and enhances performance of the device. In particular, the low-K layer inhibits remote phonon scattering and allows low trap density interfaces supporting good transport properties. Provision of low-K layer 12 thus counters the potentially detrimental effects of the high-K screening layer, giving superior device performance.

It will be appreciated that the ideal thicknesses for low-K layer 12 and screening layer 13 will depend on the materials utilized in any particular embodiment. In general, it is preferable to keep the low-K layer as thin as possible to reduce the overall coating thickness and keep the screening layer close to the semiconductor extension region. Thickness of the low-K layer can be reduced while maintaining functional efficacy by using a material of lower dielectric constant than silicon dioxide. For example, materials are known which have a dielectric constant of 2 or even less than this. Such materials, for instance SiCOH, could be exploited here if desired. Depending on the particular low-K material employed, layer 12 might have a thickness of from 0.5 to 2 nm. Similarly, the screening layer 13 of coating 11 should be of a material and arrangement such that, though separated from the extension region, this layer nonetheless provides effective screening. The required thickness of the screening layer will depend, inter alia, on the dielectric constant of this layer, a higher K allowing a reduced thickness. Typically, the thickness of the high-K layer should be of the order of the radius of the nanowire forming the extension region if the dielectric constant of the high-K layer is equal to that of the extension region. If the dielectric constant of the high-K layer is greater than that of the extension region then the layer thickness can be reduced. In general, therefore a higher K allows a reduced thickness for this layer. To this end, a screening layer of "extreme-K" material might be employed as described below with reference to FIG. 3.

Figure 3:
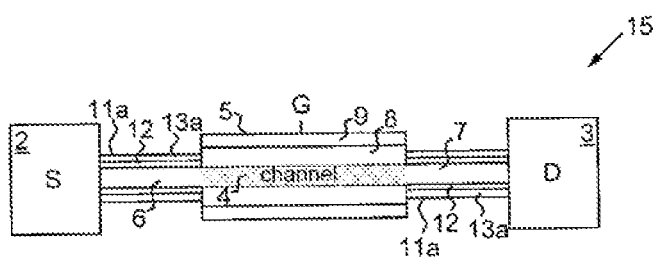
FIG. 3 illustrates a second device embodying the invention.

FIG. 3 shows a second FET device embodying the invention. The NW FET 15 corresponds generally to device 10 of FIG. 2, having a dual-layer coating 11a formed on extension regions 6 and 7. Coating 11 a has a first, low-K insulating layer 12 as in device 10. The screening layer 13a of this embodiment is however formed of an "extreme-K" insulating material. Such materials have a dielectric constant of K>25 and can have a dielectric constant K as high as several 100's. Various examples of such extreme-K materials are known, in particular ferroelectric materials such as strontium titanate. In this example, screening layer 13a is formed of $SrTiO_3$ (K~95) deposited by a process of sputtering or atomic layer deposition. The screening layer 13a here has a thickness of approximately 3 to 5 nm, significantly less than the thickness of layer 13 in FIG. 2. Using such an extreme-K material, the coating 11a can be very thin while still giving a very high average dielectric constant. Thus effective screening can be achieved while reducing overall coating thickness. This in turn reduces residual parasitic capacitances between the gate and the source/drain, further improving device performance. In general, however, depending on the K-value of the high-K layer (ranging from "ordinary" high-K materials to extreme-K materials), the high-K screening layer will typically have a thickness of from 3 to 15 nm.

Figure 4:
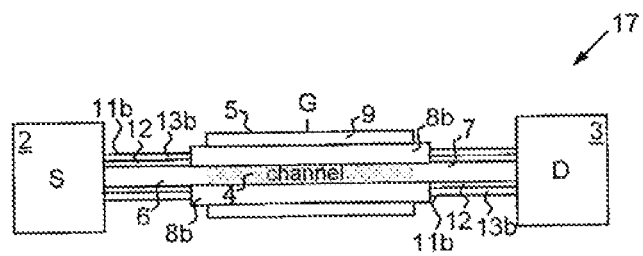
FIG. 4 illustrates a fourth device embodying the invention.

FIG. 4 shows a third NW FET embodying the invention in which the screening layer is provided by a layer of conductive material. This FET 17 corresponds generally to device 10 of FIG. 2, having a dual-layer coating 11b on extension regions 6 and 7. Coating 11b has a first, low-K insulating layer 12 as before. In this example, the conductive screening layer 13b is formed of a homogenous metallic film, e.g. of Au, which can be deposited on low-K layer 12 by a process of sputtering or evaporation. To avoid shorting the gate to the source/drain contacts, it is important that metallic film 13b is itself not shorted to the gate, i.e. there is no contact between the metallic film and gate electrode 9. In this example, this is achieved by extending the gate dielectric layer 8b beyond the gate electrode 9 and channel 4 as shown in the figure. The metallic film 13b is then formed up to, but not overlying, the gate dielectric which thus serves as a spacer between gate electrode 9 and film 13b. In this example, the metallic film 13b has a thickness of approximately 5 nm.

As before, the conductive layer 13b screens the dopant ionization potential in the underlying semiconductor from image charges, thus avoiding dopant deactivation in the extension region. In this case, however, the screening effect is provided by the free charge carriers in the conductive material of layer 13b. In alternative embodiments, other conductive materials may be used for layer 13b. For example, layer 13b could be formed of Pt, Pd, Ir, or a silicide such as $NiSi_2$. Embodiments can also be envisaged where conductive layer 13b is formed of polysilicon or a heavily-doped semiconductor provided there are sufficient charge carriers to screen the underlying extension region. If a semiconductor is employed for layer 13b, this should be degenerate so that the conductivity is unaffected by potentials applied to the gate. In any case, conductive layer 13b provides effective screening to avoid dopant deactivation, while the intervening low-K layer 12 provides improved interface properties as before, improving device performance. Moreover, effective screening can be achieved with very thin conductive layers. In particular, conductive layer 13b will typically have a thickness of from 3 to 10 nm. Thus, overall coating thickness can be reduced, reducing capacitative parasitics, leading to superior overall performance.

Figure 5:
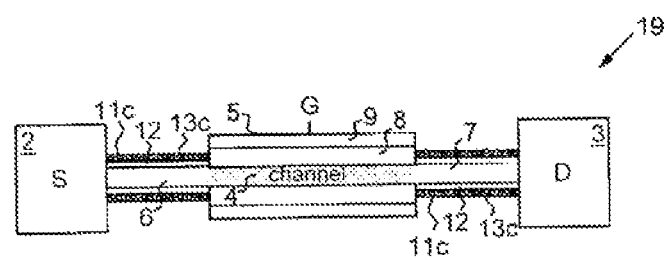
FIG. 5 illustrates a fifth device embodying the invention.
Figure 6:
FIG. 6 shows a metal-cluster layer, as employed in the fifth embodiment, applied to a nanowire.

FIG. 5 shows another embodiment of a NW FET having a screening layer of conductive material. Again, the device 19 corresponds generally to device 10 of FIG. 2, having a dual-layer coating 11c on extension regions 6 and 7. Coating 11c has a first, low-K insulating layer 12 as before. In this example, however, the conductive screening layer 13c is not formed as a continuous film but as an inhomogeneous film of metal clusters. In this example, the metal cluster film is formed by depositing gold particles by a process of evaporation. FIG. 6 is a high resolution image of a silicon nanowire coated with such a discontinuous film of gold particles, the scale bar shown here being 60 nm. The resulting cluster film 13c has a percolation length which is greater than the length of the underlying extension region 6, 7, whereby no conductive path exists through the film between the gate and the source/drain contacts. In this embodiment, therefore, the extended "spacer portions" of the gate dielectric 8b in FIG. 4 are not required to prevent shorting. The film is nonetheless dense enough to provide effective screening of the dopant ionization potentials, having a thickness corresponding to 2 nm in this example.

It will be seen from the foregoing that, by applying a coating to the extension regions as described above, embodiments of the invention provide devices with superior performance in which dopant deactivation is avoided while maintaining high conductance and mobility in the extension regions. It will be appreciated, however, that various changes can be made to the particular embodiments described while still exploiting the underlying principles discussed above. For example, in the preferred embodiments described the screening and insulating layers are each unitary layers (i.e. each is a non-composite layer, being formed of a single material layer) and the screening layer is formed directly on the insulating layer. In this way, the overall thickness of the coating can be kept low and residual parasitic effects minimized Alternatives can be envisaged, however. By way of example, a composite coating structure can be envisaged having a succession of layers, increasing from low-K to high-K, effectively forming a graded continuum in which K increases moving away from the extension region. In such an embodiment a lower portion of the continuum forms the low-K layer discussed herein and an upper portion forms the high-K layer. A simple, two-layer coating is however preferred for the reasons already described.

While exemplary materials and fabrication processes have been described above, suitable alternatives will be apparent to those skilled in the art. Individual process steps and the order in which these are performed can of course be modified as desired. Moreover, while the particular devices described are silicon NW FETs, the invention can be applied to other devices, for example other FETs such as FinFETs and Trigate FETs as well as nanowire resistors and nanowire sensors and other thin-body devices based on FET architectures. In general, devices embodying the invention may include other structures and components in addition to those described above. For example, such devices may comprise more than one transistor.

Many other changes and modifications can be made to the exemplary embodiments described without departing from the scope of the invention.

The invention claimed is:

1. A semiconductor device comprising:
a doped semiconductor having a source region, a drain region, a doped channel between the source and drain regions, and a doped extension region between the channel and each of the source and drain regions;
a gate formed on the channel; and
a screening coating on each of the extension regions, wherein no further layer is formed over the screening coating and wherein the screening coating comprises:
(i) an insulating layer that has a dielectric constant that is no greater than about half that of the extension regions and is formed directly on the extension regions, and
(ii) a screening layer formed directly on the insulating layer, wherein the screening layer screens the dopant ionization potential in the extension regions to inhibit dopant deactivation.

2. A device as claimed in claim 1 wherein the screening layer comprises a high-K insulating material.

3. A device as claimed in claim 1 wherein the screening layer comprises a conductive material.

4. A device as claimed in claim 3 wherein the screening layer comprises one of a metallic material and a silicide.

5. A device as claimed in claim 4 wherein the screening layer comprises a homogenous metallic film which is not shorted to the gate.

6. A device as claimed in claim 4 wherein the screening layer comprises an inhomogenous film of metal clusters having a percolation length greater than the length of at least one of the extension regions.

7. A device as claimed in claim 2 wherein the high-K insulating material has a dielectric constant greater than or equal to that of at least one of the extension regions.

8. A device as claimed in claim 7 wherein the high-K insulating material has a dielectric constant of K>25.

9. A device as claimed in claim 1 wherein the insulating layer has a dielectric constant that is not greater than 5.

10. A device as claimed in claim 1 wherein the insulating layer comprises semiconductor oxide.

11. A device as claimed in claim 1 wherein the insulating layer has a dielectric constant than 3.9.

12. A device as claimed claim 1 wherein the insulating layer has a thickness that ranges from 0.5 to 2 nm.

13. A device as claimed in claim 1 wherein the screening and insulating layers are each unitary layers.

14. A method for fabricating a semiconductor device, the method comprising:
forming a doped semiconductor that includes a source region, a drain region, a doped channel between the source and drain regions, and a doped extension region between the channel and each of the source and drain regions;
forming a gate on the channel; and
forming a screening coating on each of the doped extension regions, wherein no further layer is formed over the screening coating;
wherein the screening coating is formed by:
(i) forming, directly on the doped extension regions, an insulating layer that has a dielectric constant that is no greater than about half that of the extension regions, and
(ii) forming a screening layer directly on the insulating layer, wherein the screening layer screens the dopant ionization potential in the extension regions to inhibit dopant deactivation.

15. A method as recited in claim 14, wherein the step of forming the insulating layer is performed after the step of forming the doped semiconductor.

* * * * *